(12) United States Patent
Hoeppel

(10) Patent No.: US 9,741,912 B2
(45) Date of Patent: Aug. 22, 2017

(54) OPTOELECTRONIC SEMICONDUCTOR CHIP

(75) Inventor: Lutz Hoeppel, Alteglofsheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/007,053

(22) PCT Filed: Mar. 15, 2012

(86) PCT No.: PCT/EP2012/054601
§ 371 (c)(1),
(2), (4) Date: Nov. 12, 2013

(87) PCT Pub. No.: WO2012/136460
PCT Pub. Date: Oct. 11, 2012

(65) Prior Publication Data
US 2014/0061702 A1   Mar. 6, 2014

(30) Foreign Application Priority Data
Apr. 7, 2011   (DE) .......... 10 2011 016 302

(51) Int. Cl.
| | |
|---|---|
| H01L 33/60 | (2010.01) |
| H01L 33/40 | (2010.01) |
| H01L 33/44 | (2010.01) |
| H01L 33/52 | (2010.01) |
| H01L 33/62 | (2010.01) |

(Continued)

(52) U.S. Cl.
CPC ............ *H01L 33/60* (2013.01); *H01L 33/405* (2013.01); *H01L 33/44* (2013.01); *H01L 33/52* (2013.01); *H01L 33/62* (2013.01); *H01L 33/0079* (2013.01); *H01L 33/22* (2013.01); *H01L 33/382* (2013.01); *H01L 33/54* (2013.01); *H01L 33/56* (2013.01); *H01L 2924/0002* (2013.01); *H01L 2933/0016* (2013.01)

(58) Field of Classification Search
CPC ...... H01L 33/382; H01L 33/22; H01L 33/405
USPC ..................................... 257/81, 98
See application file for complete search history.

(56) References Cited

U.S. PATENT DOCUMENTS

| | | |
|---|---|---|
| 6,744,196 B1 | 6/2004 | Jeon |
| 8,319,250 B2 | 11/2012 | Rode et al. |

(Continued)

FOREIGN PATENT DOCUMENTS

| | | |
|---|---|---|
| CN | 101971371 A | 2/2011 |
| DE | 102007022947 A1 | 10/2008 |

(Continued)

*Primary Examiner* — Benjamin Sandvik
(74) *Attorney, Agent, or Firm* — Slater Matsil, LLP

(57) ABSTRACT

An optoelectronic semiconductor chip includes a semiconductor layer sequence and a carrier substrate. A first and a second electrical contact layer are arranged at least regionally between the carrier substrate and the semiconductor layer sequence and are electrically insulated from each other by an electrically insulating layer. A mirror layer is arranged between the semiconductor layer sequence and the carrier substrate. The semiconductor chip comprises a transparent encapsulation layer covering side surfaces of the semiconductor layer sequence, side surfaces of the mirror layer and side surfaces of the electrically insulating layer facing towards the side surfaces of the semiconductor chip.

15 Claims, 16 Drawing Sheets

(51) Int. Cl.
*H01L 33/00* (2010.01)
*H01L 33/22* (2010.01)
*H01L 33/38* (2010.01)
*H01L 33/54* (2010.01)
*H01L 33/56* (2010.01)

(56) References Cited

U.S. PATENT DOCUMENTS

| | | | |
|---|---|---|---|
| 8,324,650 B2 | 12/2012 | Seo et al. | |
| 8,637,876 B2 | 1/2014 | Lee et al. | |
| 8,653,540 B2 | 2/2014 | Engl et al. | |
| 8,698,178 B2 | 4/2014 | Höppel et al. | |
| 8,928,052 B2 | 1/2015 | Engl et al. | |
| 8,969,897 B2 * | 3/2015 | Choi | H01L 33/382 257/98 |
| 9,190,270 B2 * | 11/2015 | Tak | H01L 21/0254 |
| 9,276,167 B2 * | 3/2016 | Hoppel | H01L 33/20 |
| 9,570,658 B2 * | 2/2017 | Matsumura | H01L 33/382 |
| 9,627,588 B2 * | 4/2017 | Hoppel | H01L 33/382 |
| 9,640,726 B2 * | 5/2017 | Lee | H01L 33/38 |
| 2007/0295968 A1 | 12/2007 | Tan et al. | |
| 2009/0121241 A1 | 5/2009 | Keller et al. | |
| 2010/0038669 A1 | 2/2010 | McKenzie | |
| 2010/0171135 A1 * | 7/2010 | Engl et al. | 257/98 |
| 2011/0049555 A1 | 3/2011 | Engl et al. | |
| 2011/0193123 A1 * | 8/2011 | Moon | H01L 33/382 257/98 |
| 2011/0284822 A1 * | 11/2011 | Jung | H01L 33/505 257/13 |

FOREIGN PATENT DOCUMENTS

| | | |
|---|---|---|
| DE | 102008030584 A1 | 12/2009 |
| DE | 102009022966 A1 | 12/2010 |
| DE | 102009033686 A1 | 1/2011 |
| DE | 102010044986 A1 | 3/2012 |
| JP | 2009076896 A | 4/2009 |
| JP | 2010525585 A | 7/2010 |
| JP | 2011503898 A | 1/2011 |
| JP | 2011054967 A | 3/2011 |
| JP | 2011066048 A | 3/2011 |
| JP | 2011139038 A | 7/2011 |
| TW | 200903863 A | 1/2009 |
| TW | 200950161 A | 12/2009 |
| WO | 2008131735 A1 | 11/2008 |
| WO | 2009061704 A2 | 5/2009 |
| WO | 2009106069 A1 | 9/2009 |
| WO | 2009121319 A1 | 10/2009 |
| WO | 2009135457 A1 | 11/2009 |
| WO | WO 2010136326 A1 * | 12/2010 |
| WO | 2011006719 A1 | 1/2011 |
| WO | 2012031852 A1 | 3/2012 |

* cited by examiner

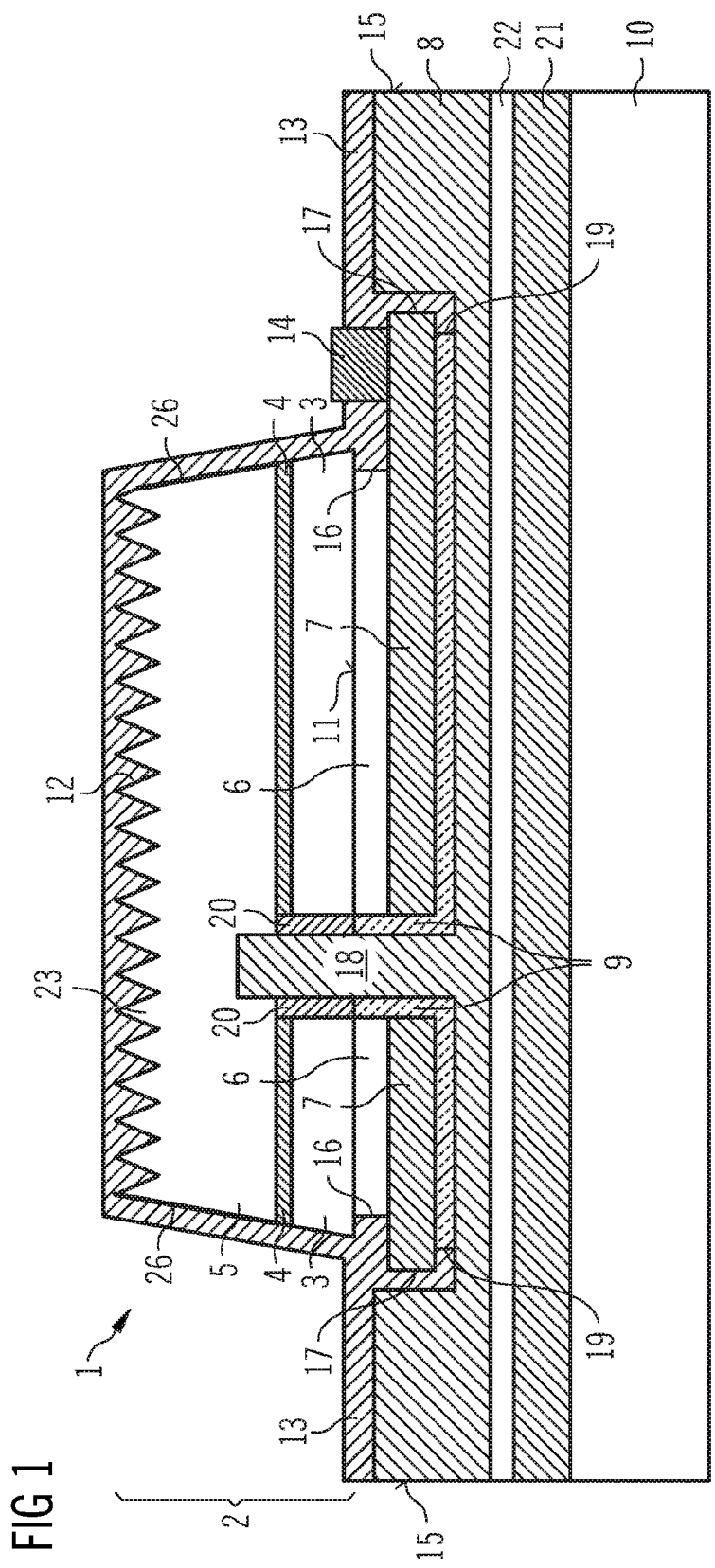

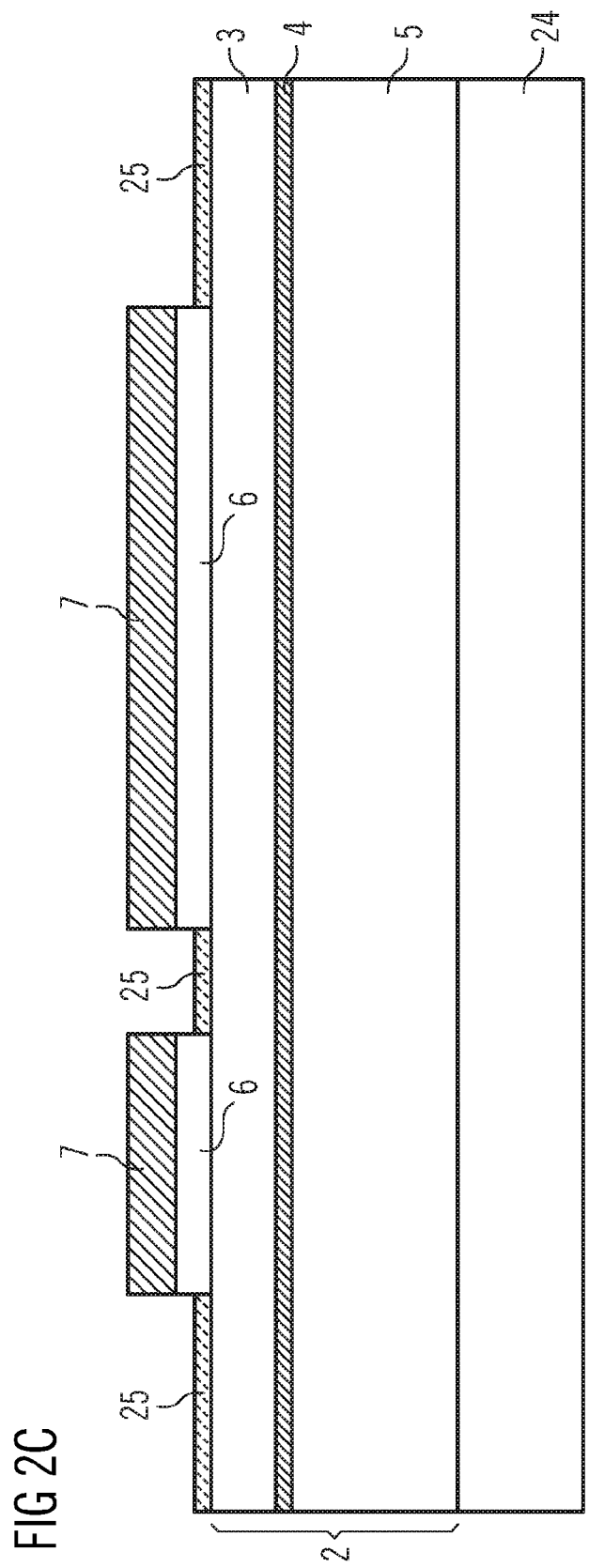

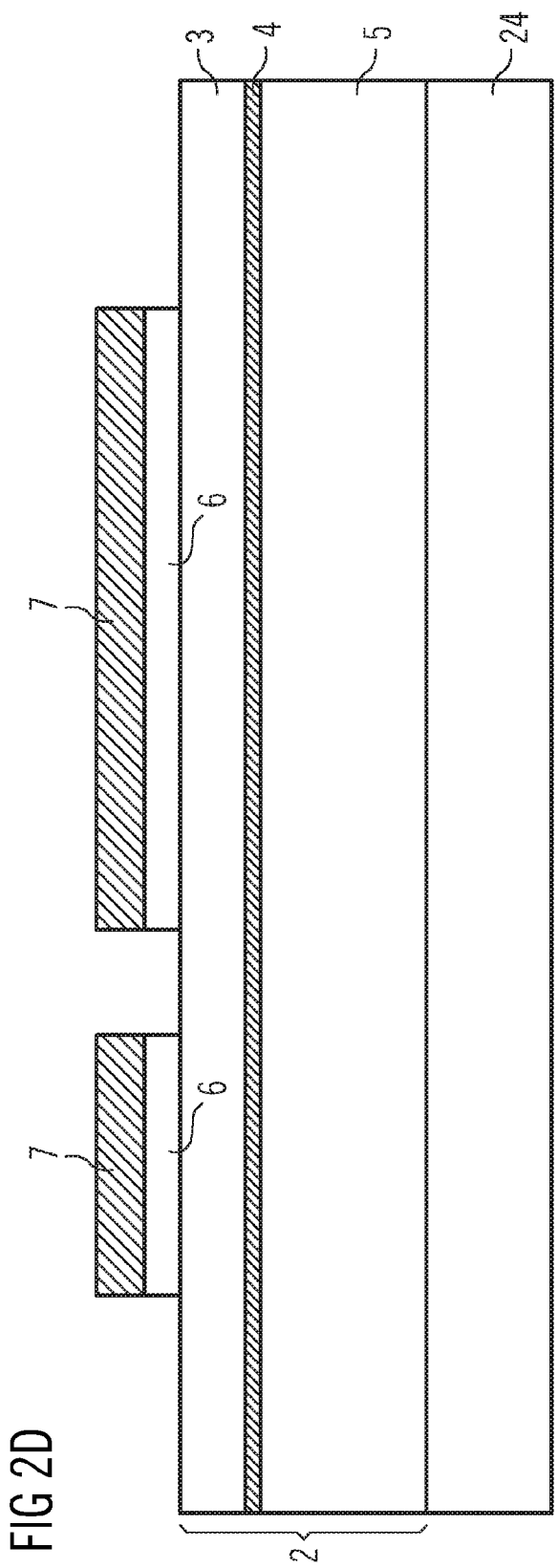

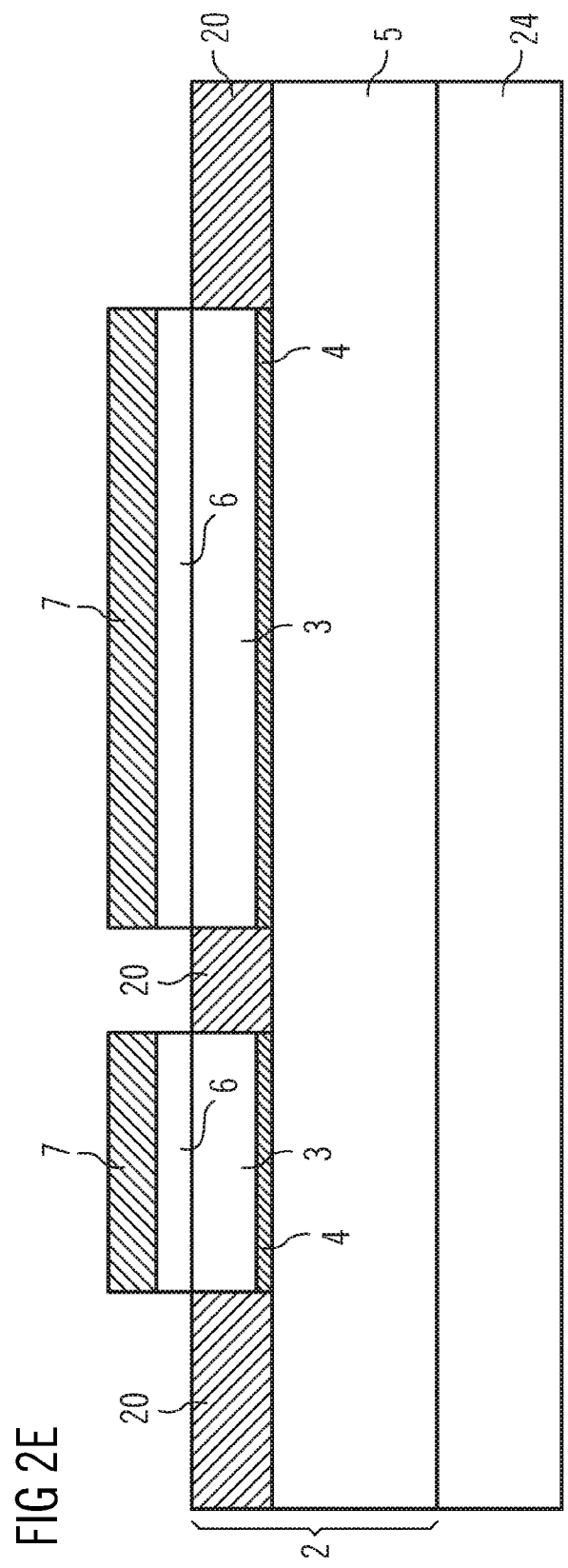

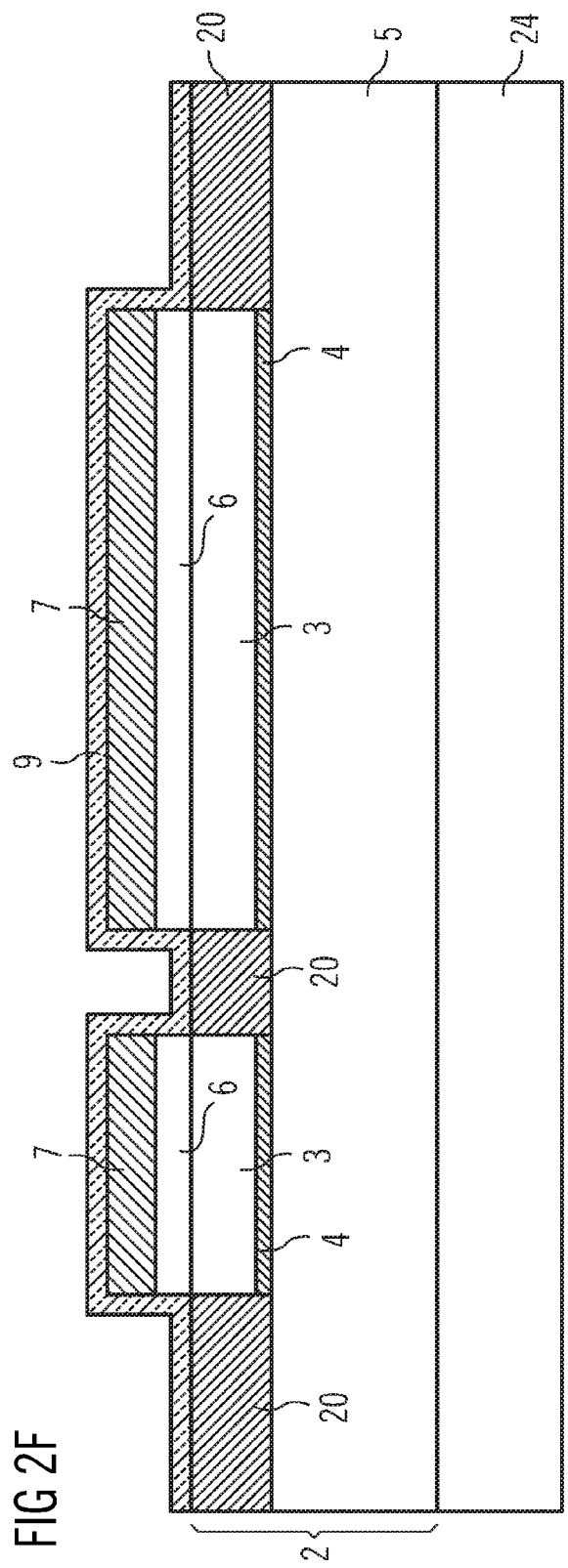

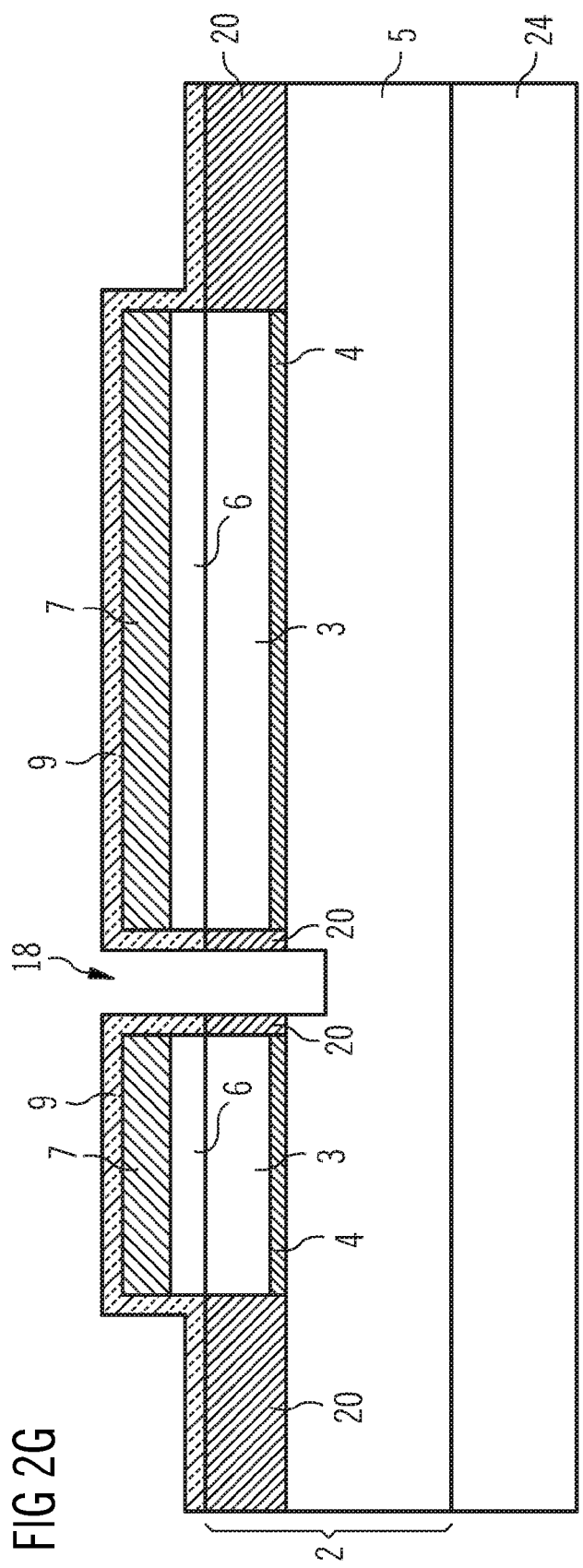

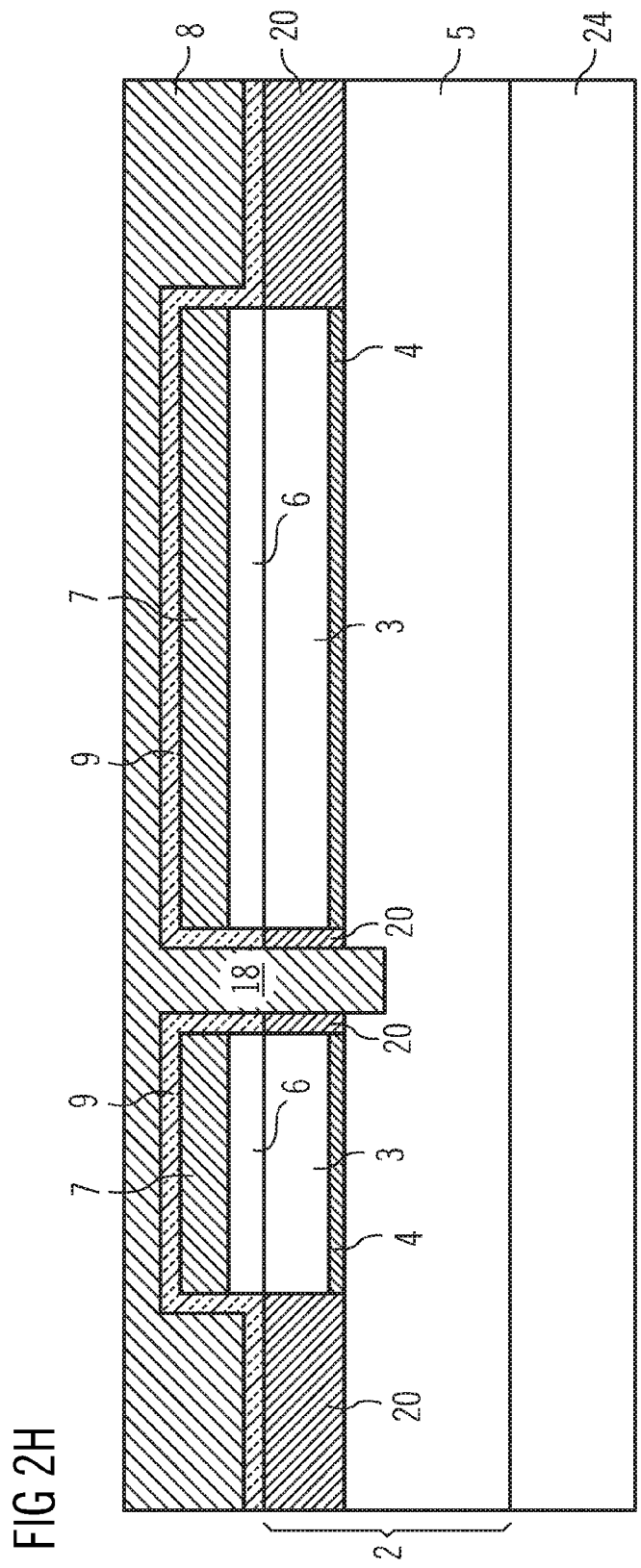

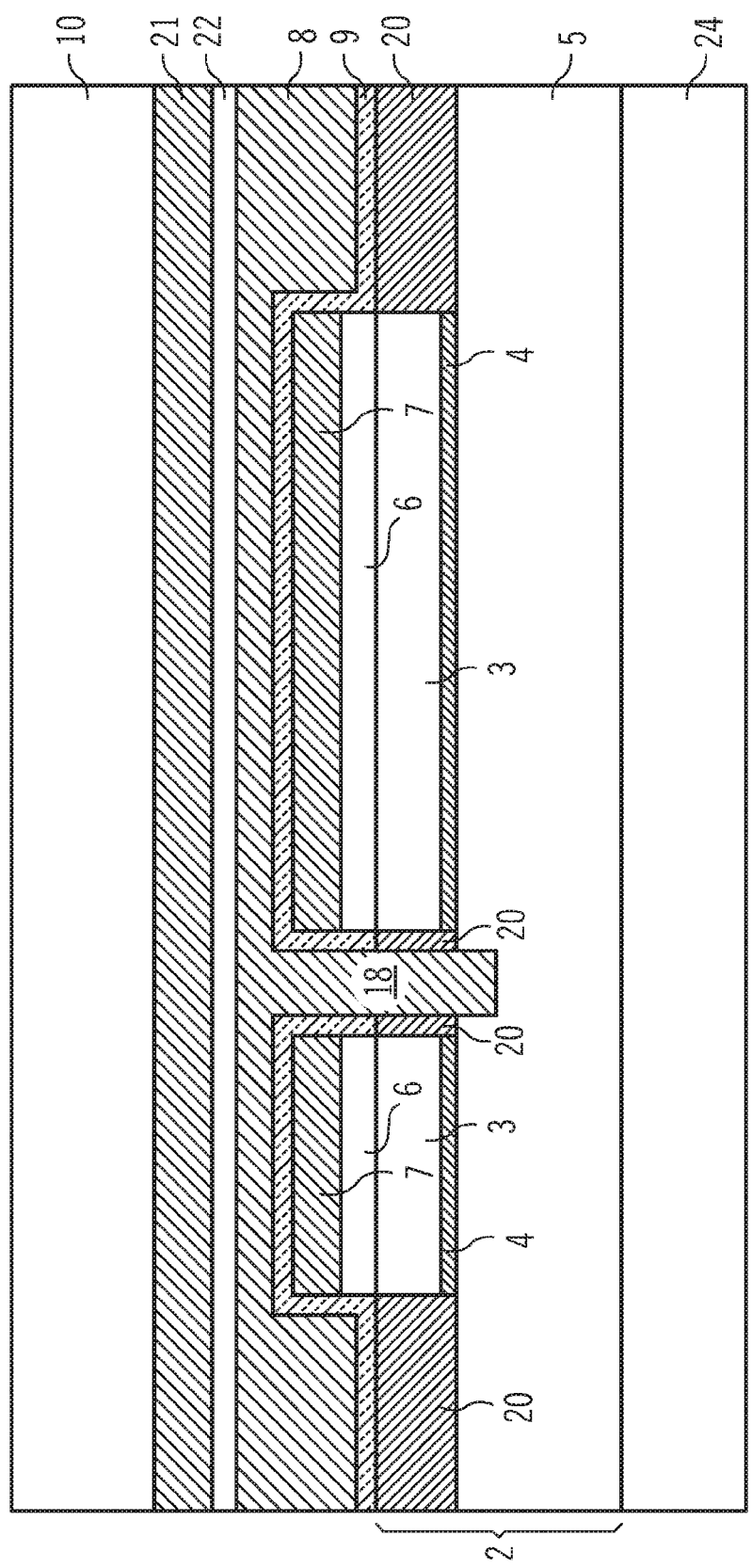

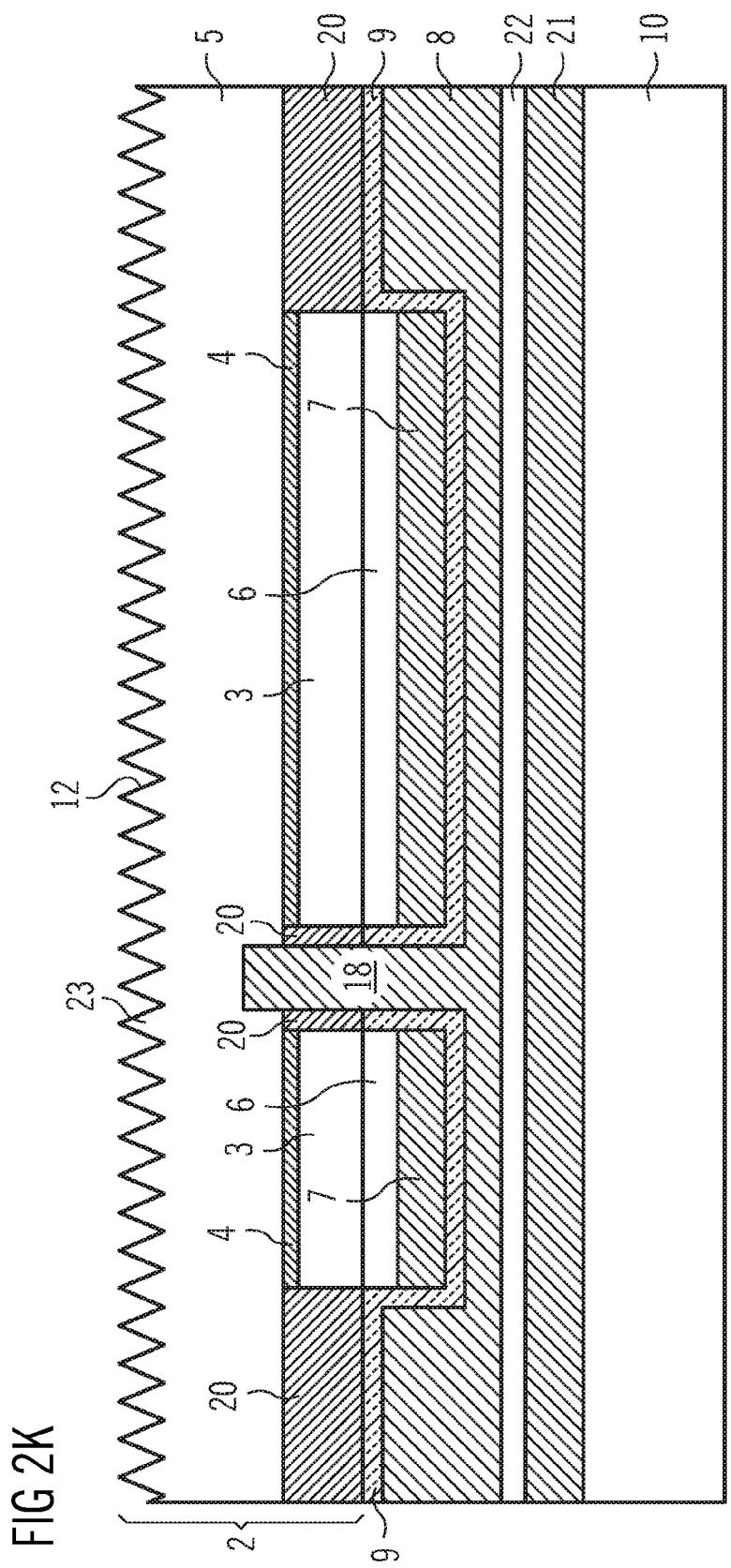

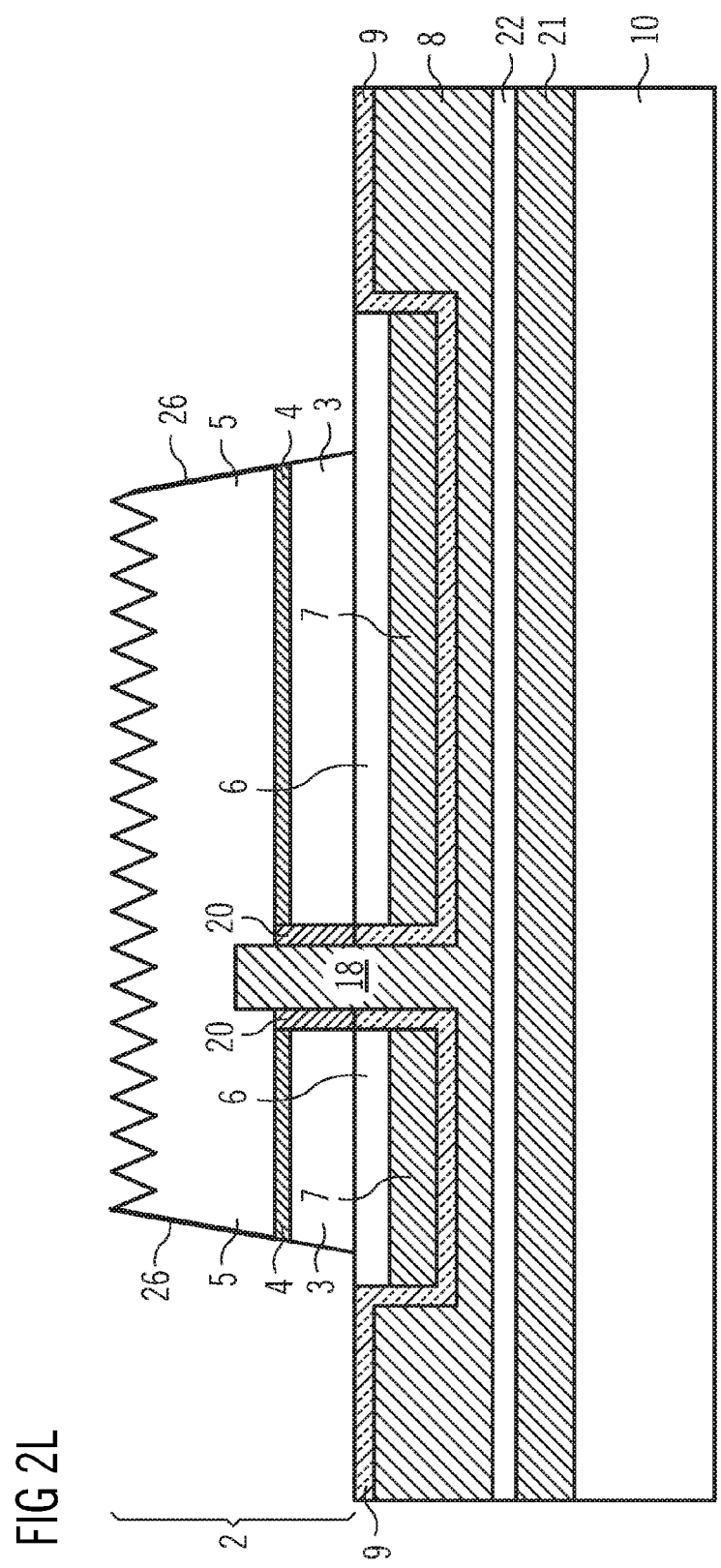

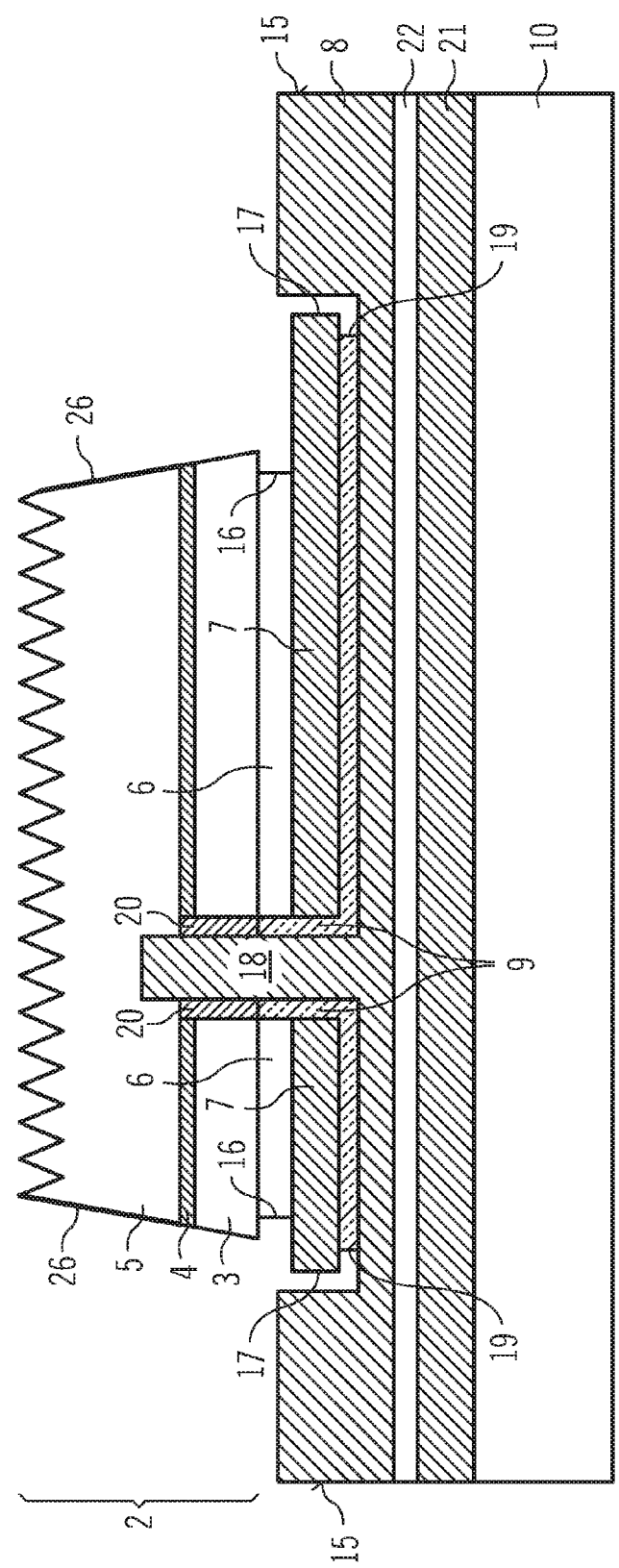

OPTOELECTRONIC SEMICONDUCTOR CHIP

This patent application is a national phase filing under section 371 of PCT/EP2012/054601, filed Mar. 15, 2012, which claims the priority of German patent application 10 2011 016 302.6, filed Apr. 7, 2011, each of which is incorporated herein by reference in its entirety.

TECHNICAL FIELD

The invention relates to an optoelectronic semiconductor chip.

BACKGROUND

International Patent Publication No. WO 2009/106069 A1 discloses an optoelectronic semiconductor chip in which a first and a second electrical contact layer are arranged between the semiconductor layer sequence and the carrier substrate. In this case, the first and second electrical contact layers are insulated from one another by means of an electrically insulating layer. In the case of a semiconductor chip of this type, a mirror layer can adjoin the semiconductor layer sequence at a side facing the carrier substrate in order to deflect the radiation emitted by the active zone in the direction of the carrier substrate to a radiation coupling-out surface situated opposite the carrier substrate.

In the case of a semiconductor chip of this type, there may be the risk of moisture being transported from the edges of the semiconductor chip through the electrically insulating layer right into the region of the mirror layer, which would result in a degradation of the mirror layer and hence a reduction of the radiation efficiency.

SUMMARY OF THE INVENTION

Embodiments of the invention specify an improved optoelectronic semiconductor chip in which the mirror layer is effectively protected against ingress of moisture and at the same time an efficient electrical contact-connection of the semiconductor chip is obtained with comparatively low production outlay.

In accordance with one configuration, the optoelectronic semiconductor chip comprises a semiconductor layer sequence having a first semiconductor region of a first conduction type, a second semiconductor region of a second conduction type, and an active zone arranged between the first semiconductor region and the second semiconductor region.

Furthermore, the optoelectronic semiconductor chip comprises a carrier substrate, wherein the semiconductor layer sequence has a first main surface facing the carrier substrate, and an opposite second main surface. A first electrical contact layer and a second electrical contact layer are arranged at least regionally between the carrier substrate and the first main surface of the semiconductor layer sequence, wherein the second electrical contact layer is led through a perforation in the first semiconductor region and the active zone into the second semiconductor region. The first electrical contact layer and the second electrical contact layer are insulated from one another by an electrically insulating layer.

A mirror layer is arranged between the semiconductor layer sequence and the carrier substrate. The mirror layer can adjoin the semiconductor layer sequence in particular at the first main surface. The mirror layer advantageously reflects radiation emitted by the active zone in the direction of the carrier substrate to the second main surface of the semiconductor layer sequence, said second main surface serving as a radiation coupling-out surface. The mirror layer adjoins in particular partial regions of the first electrical contact layer and partial regions of the electrically insulating layer, wherein the interface of the mirror layer that faces the carrier substrate is covered by the first electrical contact layer.

The optoelectronic semiconductor chip comprises a transparent encapsulation layer, which covers the side surfaces of the semiconductor layer sequence and the side surfaces of the mirror layer. Furthermore, the transparent encapsulation layer also covers side surfaces of the electrically insulating layer which face the side surfaces of the semiconductor chip.

By virtue of the fact that the transparent encapsulation layer covers the side surfaces of the semiconductor layer sequence and of the mirror layer, the mirror layer is protected against ingress of moisture. This protective effect of the transparent encapsulation layer is further improved by the transparent encapsulation layer also covering the side surfaces of the electrically insulating layer which face the side surfaces of the semiconductor chip. In this way, in particular, ingress of moisture into the electrically insulating layer is prevented and the risk of moisture propagating through the electrically insulating layer as far as the mirror layer is thus reduced.

Preferably, the electrically insulating layer at no point adjoins a surrounding medium of the optoelectronic semiconductor chip. This advantageously ensures that moisture cannot penetrate from outside into the electrically insulating layer and propagate in the layer system of the semiconductor chip.

The transparent encapsulation layer preferably contains an aluminum oxide such as $Al_2O_3$, for example, or a silicon oxide such as $SiO_2$, for example, or consists thereof.

Particularly preferably, the transparent encapsulation layer comprises an ALD layer, i.e., a layer produced by means of atomic layer deposition (ALD). In a further advantageous configuration, the transparent encapsulation layer comprises a spin-on glass. An ALD layer or a spin-on glass is advantageously distinguished by a low defect density and affords good protection against ingress of moisture. Applying the transparent encapsulation layer by means of ALD or as spin-on glass furthermore has the advantage that the transparent encapsulation layer can be introduced into small interspaces.

In particular, it is advantageous if the mirror layer has a smaller lateral extent than the semiconductor layer sequence, and partial regions of the transparent encapsulation layer extend below the semiconductor layer sequence. Particularly, good protection of the mirror layer against oxidation and/or ingress of moisture is obtained in this way. Preferably, the semiconductor layer sequence has an overhang over the mirror layer at all side surfaces. The side surfaces of the mirror layer are advantageously adjoined by an interspace formed between the semiconductor layer sequence and a layer sequence applied to the carrier substrate. The interspace is advantageously filled by the transparent encapsulation layer.

In one preferred configuration, the second main surface of the semiconductor chip, which serves in particular as a radiation exit surface, is covered by the transparent encapsulation layer.

The semiconductor layer sequence is preferably covered by the transparent encapsulation layer completely, i.e., including the side surfaces.

In one advantageous configuration, the semiconductor layer sequence has a mesa structure, wherein the first electrical contact layer and the second electrical contact layer extend right into regions of the semiconductor chip that are arranged laterally alongside the mesa structure.

The transparent encapsulation layer preferably has alongside the mesa structure an opening in which a connection contact for the first electrical contact layer is arranged. In this case, the connection contact is advantageously arranged alongside the semiconductor layer sequence, such that, in particular, a second main surface of the semiconductor layer sequence functioning as radiation exit surface is free of connection contacts. This has the advantage that the radiation exit surface is not shaded by the connection contact and, consequently the efficiency of the semiconductor chip increases. The connection contact is preferably arranged outside the center of the semiconductor chip, in particular, in a corner of the semiconductor chip.

The first electrical contact layer advantageously serves firstly for making electrical contact with the semiconductor chip and secondly for protecting the mirror layer against corrosion. In particular, at least one part of the interface of the mirror layer facing the carrier substrate is covered by the first electrical contact layer.

The first electrical contact layer preferably contains gold, titanium, chromium, platinum, titanium nitride, titanium tungsten nitride or nickel or consists thereof. These materials are advantageously distinguished firstly by a good electrical conductivity and secondly by their suitability as a diffusion barrier. The first electrical contact layer can comprise a plurality of sublayers which preferably each contain at least one of the materials.

The mirror layer preferably contains silver, aluminum or a silver or aluminum alloy or consists thereof. Silver and aluminum are distinguished by high reflection in the visible spectral range. Furthermore, these materials have a good electrical conductivity and form a metal-semiconductor contact having a low contact resistance. This is advantageous since the mirror layer advantageously adjoins the semiconductor layer sequence and in this way electrically conductively connects the first semiconductor region to the first electrical contact layer.

The second electrical contact layer, like the mirror layer, preferably contains silver, aluminum or a silver or aluminum alloy, or consists thereof. High reflection in the visible spectral range and a good electrical conductivity are advantageous for the second electrical contact layer, since the second electrical contact layer also adjoins the semiconductor layer sequence at least regionally and in this way makes electrical contact with the second semiconductor region.

The electrically insulating layer, which insulates the first electrical contact layer and the second electrical contact layer from one another, preferably contains a silicon oxide, a silicon nitride, a silicon oxynitride or an aluminum oxide.

In one preferred embodiment, the first semiconductor region is a p-type semiconductor region and the second semiconductor region is an n-type semiconductor region. In this configuration, therefore, the mirror layer adjoins the p-type semiconductor region, and the second electrical contact layer is led through the perforation into the n-type semiconductor region. The p-type semiconductor region faces the carrier substrate and the n-type semiconductor region faces the second main surface of the semiconductor layer sequence serving as radiation exit surface.

In a further advantageous configuration, the semiconductor layer sequence of the optoelectronic semiconductor chip has no growth substrate. In this case, the semiconductor chip is a so-called thin-film light-emitting diode chip, in which the growth substrate used for the epitaxial growth of the semiconductor layer sequence was detached after the connection of the semiconductor layer sequence to the carrier substrate.

The semiconductor chip is preferably connected to the carrier substrate by means of a solder layer. In particular, the semiconductor chip can be connected to the carrier substrate at the side situated opposite the original growth substrate.

BRIEF DESCRIPTION OF THE DRAWINGS

The invention is explained in greater detail below on the basis of an exemplary embodiment in association with FIGS. 1 and 2.

FIG. 1 shows a schematic illustration of a cross section through an optoelectronic semiconductor chip in accordance with one exemplary embodiment.

Figure 2A:
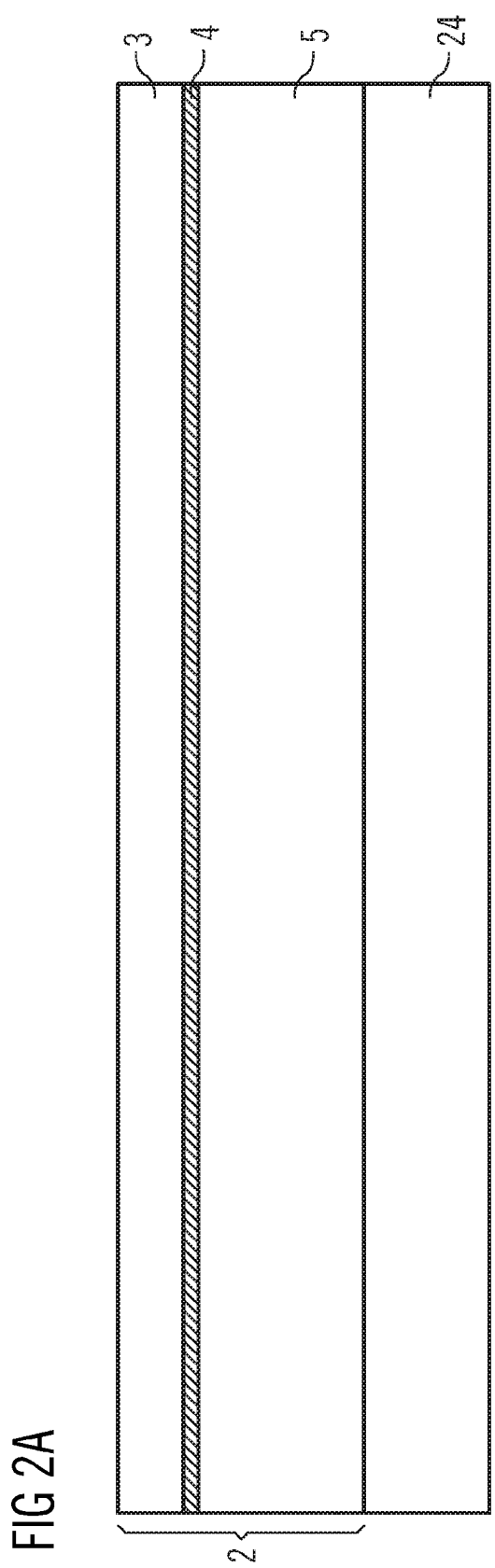
FIGS. 2A to 2O show a schematic illustration of a method for producing the optoelectronic semiconductor chip illustrated in FIG. 1 on the basis of intermediate steps.

Identical or identically acting component parts are provided with the same reference signs in each case in the figures. The illustrated component parts and the size relationships of the component parts among one another should not be regarded as true to scale.

DETAILED DESCRIPTION OF ILLUSTRATIVE EMBODIMENTS

The optoelectronic semiconductor chip 1 illustrated schematically in cross section in FIG. 1 contains a semiconductor layer sequence 2 having a first semiconductor region 3 of a first conduction type and a second semiconductor region 5 of a second conduction type. Preferably, the first semiconductor region 3 is a p-type semiconductor region and the second semiconductor region 5 is an n-type semiconductor region. An active zone 4 is arranged between the first semiconductor region 3 and the second semiconductor region 5.

The active zone 4 of the optoelectronic semiconductor chip 1 can be, in particular, an active zone suitable for emitting radiation. In this case, the optoelectronic semiconductor chip 1 is a luminescence diode, in particular an LED. Alternatively, it would also be conceivable for the active zone 4 to be a radiation-detecting layer, wherein the optoelectronic semiconductor chip 1 in this case is a detector component. The active zone 4 can be embodied, for example, as a pn junction, as a double heterostructure, as a single quantum well structure or multiple quantum well structure.

The semiconductor layer sequence 2 of the semiconductor chip 1 is preferably based on a III-V compound semiconductor material, in particular on an arsenide, nitride or phosphide compound semiconductor material. By way of example, the semiconductor layer sequence 2 can contain $In_xAl_yGa_{1-x-y}N$, $In_xAl_yGa_{1-x-y}P$ or $In_xAl_yGa_{1-x-y}As$, in each case where $0 \le 1$ $x \le 1$, $0 \le y \le 1$ and $x+y \le 1$. In this case, the III-V compound semiconductor material need not necessarily have a mathematically exact composition according to one of the above formulae. Rather, it can comprise one or more dopants and additional constituents which substantially do not change the physical properties of the material. For the sake of simplicity, however, the above formulae only include the essential constituents of the crystal lattice, even if these can be replaced in part by small amounts of further substances.

The semiconductor chip 1 is connected to a carrier substrate 10 by a connecting layer 21, which can be, in particular, a solder layer composed of a metal or a metal alloy.

For electrical contact-connection, the semiconductor chip 1 has a first electrical contact layer 7 and a second electrical contact layer 8. The first electrical contact layer 7 is electrically conductively connected to the first semiconductor region 3, and the second electrical contact layer 8 is electrically conductively connected to the second semiconductor region 5.

Both the first electrical contact layer 7 and the second electrical contact layer 8 are arranged at least regionally between a first main surface 11 of the semiconductor layer sequence 2 facing the carrier substrate 10 and the carrier substrate 10. The first electrical contact layer 7 and the second electrical contact layer 8 are electrically insulated from one another by means of an electrically insulating layer 9. The electrically insulating layer 9 preferably contains a silicon oxide, a silicon nitride, a silicon oxynitride, an aluminum oxide or consists thereof. Alternatively, the electrically insulating layer 9 can also contain other oxides or nitrides.

The second main surface 12 of the semiconductor layer sequence 2 situated opposite the carrier substrate 10 serves as a radiation coupling-out surface of the optoelectronic semiconductor chip 1 and is advantageously free of electrical contact layers. In order to improve the coupling-out of radiation, the second main surface 12 can be provided with a coupling-out structure 23 or a roughening.

In order to improve the radiation efficiency of the optoelectronic semiconductor chip 1, a mirror layer 6 is arranged between the semiconductor layer sequence 2 and the carrier substrate 10. The mirror layer 6 is disposed downstream of the first semiconductor region 3 at the side facing the carrier substrate 10 and can adjoin, in particular, the first main surface 11 of the semiconductor layer sequence 2. It is also possible for an intermediate layer, for example, a thin adhesion promoter layer, to be arranged between the first semiconductor region 3 and the mirror layer 6. The mirror layer 6 contains, in particular, silver, aluminum or a metal alloy comprising silver or aluminum. These materials are distinguished by a high reflectivity in the visible spectral range and a good electrical conductivity. The mirror layer 6 firstly has the function of reflecting radiation emitted by the active zone 4 in the direction of the carrier substrate 10 to the radiation coupling-out surface 12. Furthermore, the mirror layer 6 also serves for making electrical contact with the first semiconductor region 3. In particular, the mirror layer 6 adjoins the first electrical contact layer 7 at the side facing the carrier substrate 10 and is therefore electrically conductively connected to the first electrical contact layer 7.

The first electrical contact layer 7 preferably covers the interface of the mirror layer facing the carrier substrate 10. The first electrical contact layer 7 preferably contains gold, titanium, chromium, platinum, titanium nitride, titanium tungsten nitride or nickel or consists thereof. These materials are distinguished by the fact that they are electrically conductive and additionally chemically inert. In this way, the mirror layer 6 is advantageously protected against corrosion in the regions in which it is covered by the first electrical contact layer 7.

The second electrical contact layer 8 is electrically conductively connected to the second semiconductor region 5 through a perforation 18 running through the first semiconductor region 3 and the active zone 4. In the region of the perforation 18, the active zone 4, the first semiconductor region 3, the mirror layer 6 and the first electrical contact layer 7 are insulated from the second electrical contact layer 8 by means of the electrically insulating layer 9 or passivated regions 20 of the semiconductor layer sequence 2.

The second electrical contact layer 8, in the regions in which it directly adjoins the semiconductor layer sequence 2, advantageously functions not only as a contact layer, but also as a reflective layer that reflects radiation toward the second main surface 12 of the semiconductor layer sequence 2 serving as radiation exit surface. The second electrical contact layer 8 therefore advantageously comprises a metal or a metal alloy having a high reflectivity, in particular silver, aluminum or an alloy comprising silver or aluminum.

In the semiconductor chip 1, the side surfaces 26 of the semiconductor layer sequence 2 and the side surfaces 16 of the mirror layer 6 are covered by an electrically insulating transparent encapsulation layer 13. The encapsulation layer 13 firstly has the function of protecting the mirror layer 6 against corrosion. In particular, the mirror layer 6 is protected against oxidation or ingress of moisture by the encapsulation layer 13. The side surfaces 16 of the mirror layer 6 are preferably surrounded by the encapsulation layer 13 on all sides, such that the mirror layer 6 at no point directly adjoins the surrounding medium.

The transparent encapsulation layer 13 furthermore also covers the side surfaces 17 of the first contact layer 7 and the side surfaces 19 of the electrically insulating layer 9 facing the side surfaces 15 of the semiconductor chip 1. In particular, ingress of moisture into the electrically insulating layer 9 is prevented in this way. Particularly preferably, the electrically insulating layer 9 at no point adjoins a surrounding medium of the semiconductor chip 1.

The transparent encapsulation layer 13 is preferably an aluminum oxide layer, in particular an $Al_2O_3$ layer, or a silicon oxide layer, in particular a $SiO_2$ layer. The transparent encapsulation layer is advantageously deposited by means of atomic layer deposition or as spin-on glass. Such a silicon oxide layer deposited by means of ALD or as spin-on glass advantageously has a high resistance to corrosion and ingress of moisture.

In one particularly preferred configuration, the mirror layer 6 has a smaller lateral extent than the semiconductor layer sequence 2, such that partial regions of the transparent encapsulation layer 13 extend below the semiconductor layer sequence 2. In this configuration, the side surfaces 16 of the mirror layer 6 are advantageously spaced apart from the side surfaces 26 of the semiconductor layer sequence 2. The distance between the side surfaces 26 of the semiconductor layer sequence 2 and the side surfaces 16 of the mirror layer 6 is preferably between 0.5 µm and 5 µm, particularly preferably approximately 3 µm. The mirror layer 6 is protected particularly effectively in this way. Particularly, by producing the transparent encapsulation layer 13 by means of atomic layer deposition, it is possible to deposit the transparent encapsulation layer 13 in such a way that it fills the interspace between the semiconductor layer sequence 2 and the mirror layer 6.

The transparent encapsulation layer 13 advantageously also covers the side surfaces 26 and the second main surface 12 of the semiconductor layer sequence 2 serving as radiation exit surface. The semiconductor layer sequence 2 is therefore advantageously completely covered by the transparent encapsulation layer 13. Advantageously, fine cracks possibly present at the surfaces of the semiconductor layer sequence 2 can be closed by the transparent encapsulation layer 13. The complete encapsulation of the semiconductor layer sequence 2 is therefore advantageous for the long-term stability of the semiconductor chip.

The semiconductor layer sequence 2 has a mesa structure, wherein the first electrical contact layer 7 and the second electrical contact layer 8 extend laterally alongside the mesa structure. The transparent encapsulation layer 13 has alongside the mesa structure an opening in which a connection contact 14 is arranged, said connection contact being connected to the first electrical contact layer. The connection contact 14 can be, in particular, a bonding pad provided for the connection of a bonding wire.

The connection contact 14 is preferably arranged outside the center of the semiconductor chip 1, in particular in the region of a corner of the semiconductor chip 1.

When the semiconductor chip 1 is viewed from above, advantageously essentially only the second electrical contact layer 8 is visible through the transparent encapsulation layer 13 alongside the semiconductor layer sequence 2 structured as a mesa, said second electrical contact layer advantageously containing a highly reflective metal such as a Ag or Al, for example. Regions of the first electrical contact layer 7, which can contain a less reflective material such as platinum, for example, are visible only in a small region around the connection contact 14.

The second electrical contact layer 8 can be electrically connected externally, for example, via the rear side of the semiconductor chip 1, in particular via an electrically conductive carrier substrate 10 and the solder layer 21. A barrier layer 22 can be arranged between the solder layer 21 and the second electrical contact layer 8, said barrier layer preventing in particular a diffusion of constituents of the solder layer 21 into the second electrical contact layer 8, and vice versa.

One exemplary embodiment of a method for producing the optoelectronic semiconductor chip is described in the following FIGS. 2A to 2O. The above-described advantageous configurations of individual component parts of the optoelectronic semiconductor chip apply in the same way to the method described below, and vice versa.

In the intermediate step of the method as illustrated in FIG. 2A, the semiconductor layer sequence 2 comprising the first semiconductor region 3, the active zone 4 and the second semiconductor region 5 has been grown onto a growth substrate 24. The growth is preferably effected epitaxially, in particular by means of MOVPE. The semiconductor layer sequence 2 can contain nitride compound semiconductor materials, for example, and the growth substrate 24 can be a sapphire substrate. The first semiconductor region 3 is preferably a p-type semiconductor region, and the second semiconductor region 5 is preferably an n-type semiconductor region.

Figure 2B:
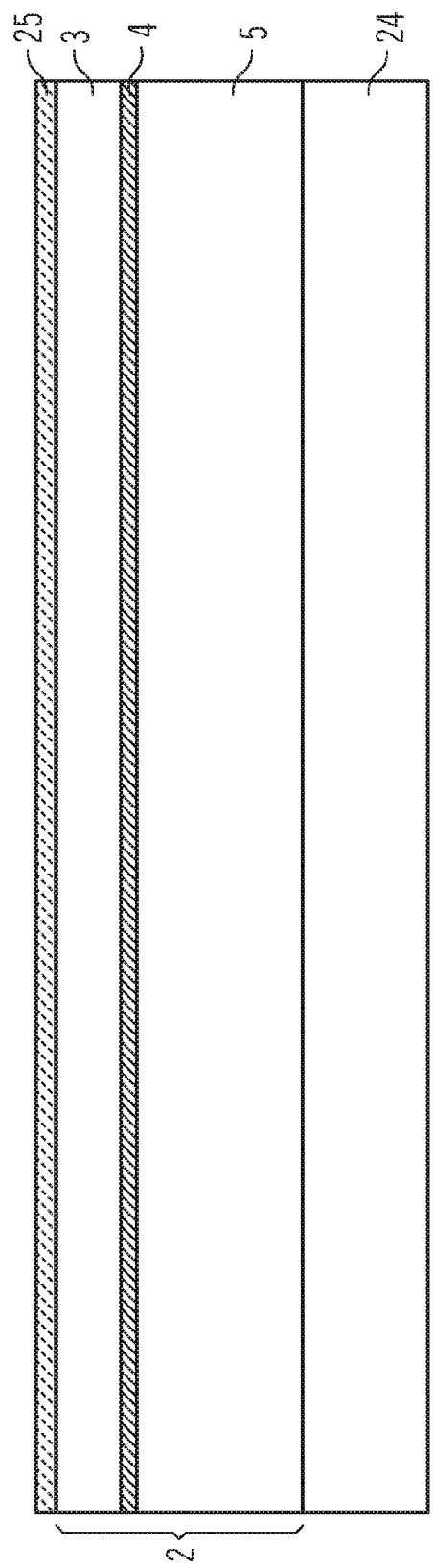

In the method step illustrated in FIG. 2B, an oxide layer 25, for example, a silicon oxide layer, was applied to the second semiconductor region 5. The oxide layer 25 serves for protecting the first semiconductor region 3 during subsequent photolithography and etching processes.

In the intermediate step illustrated in FIG. 2C, the oxide layer was patterned photolithographically, for example. Furthermore, the mirror layer 6 and the first electrical contact layer 7 were applied and lifted off from the regions still covered with the oxide layer 25 by means of lift-off technology. Advantageously, therefore, the mirror layer 6 and the first electrical contact layer are patterned in the same method step. The mirror layer 6 contains, in particular, silver, aluminum or a metal alloy comprising silver or aluminum. The first electrical contact layer 7 covers the surface of the mirror layer 6 and in this way firstly produces the electrical connection to the first semiconductor region 3, and secondly serves as encapsulation for the material of the mirror layer 6. The first electrical contact layer 7 can contain, in particular, gold, titanium, chromium, platinum, titanium nitride, titanium tungsten nitride or nickel or consist thereof. It is also possible for the first electrical contact layer 7 to comprise a plurality of sublayers. By way of example, the first electrical contact layer 7 can comprise a Ti/Pt/Au/Cr layer sequence.

In the method step illustrated in FIG. 2D, the oxide layer applied previously has been removed again, for example, by etching by means of buffered hydrofluoric acid (BOE—Buffered Oxide Etch).

In the intermediate step illustrated in FIG. 2E, the p-doped semiconductor region 3 has been passivated in regions 20 arranged between and outside the regions of the semiconductor layer sequence 2 that are covered by the mirror layer 6 and the first electrical contact layer 7. The passivated regions 20 can be produced for example by bombardment of the p-doped semiconductor material 3 with argon ions. Preferably, the passivated regions 20 extend right into the active layer 4, such that the pn junction is severed by the electrically insulating passivated regions 20. Instead of passivating the regions 20, it is alternatively also possible to remove them by sputtering.

In the intermediate step illustrated in FIG. 2F, an electrically insulating layer 9 was applied to the structure produced in this way. The electrically insulating layer 9 can be, in particular, a silicon oxide layer or a silicon nitride layer.

In the intermediate step illustrated in FIG. 2G, a perforation 18 was produced in the electrically insulating layer 9 and the semiconductor layer sequence 2. The perforation 18 is produced by means of photolithography and reactive ion etching, for example. The perforation 18 extends through the passivated regions 20 of the first semiconductor region 3 and of the active layer 4 right into the second semiconductor region 5.

In the intermediate step illustrated in FIG. 2H, the entire layer structure produced previously was covered with the second electrical contact layer 8. The second electrical contact layer 8 preferably contains silver, aluminum or an alloy comprising silver or aluminum. The second electrical contact layer 8 serves for making electrical contact with the second semiconductor region 5, which can be an n-type semiconductor region, in particular. The second electrical contact layer 8 extends through the perforation 18 right into the second semiconductor region 5.

In the intermediate step illustrated in FIG. 2I, the semiconductor chip has been connected to a carrier substrate 10 at a side facing away from the growth substrate 24 by means of a solder layer 21. Before the connection of the carrier substrate 10 to the semiconductor chip, a barrier layer 22 is preferably applied to the second electrical contact layer 8 in order to protect the second electrical contact layer 8, preferably containing silver or aluminum, against a diffusion of constituents of the solder layer 21. The solder layer 21 can contain AuSn, in particular. The barrier layer 22 can contain TiWN, for example.

The carrier substrate 10 is preferably an electrically conductive substrate, for example, a doped semiconductor wafer composed of silicon or germanium. Alternatively, the carrier substrate 10 can also be formed by an electrodeposited metal layer.

Figure 2J:
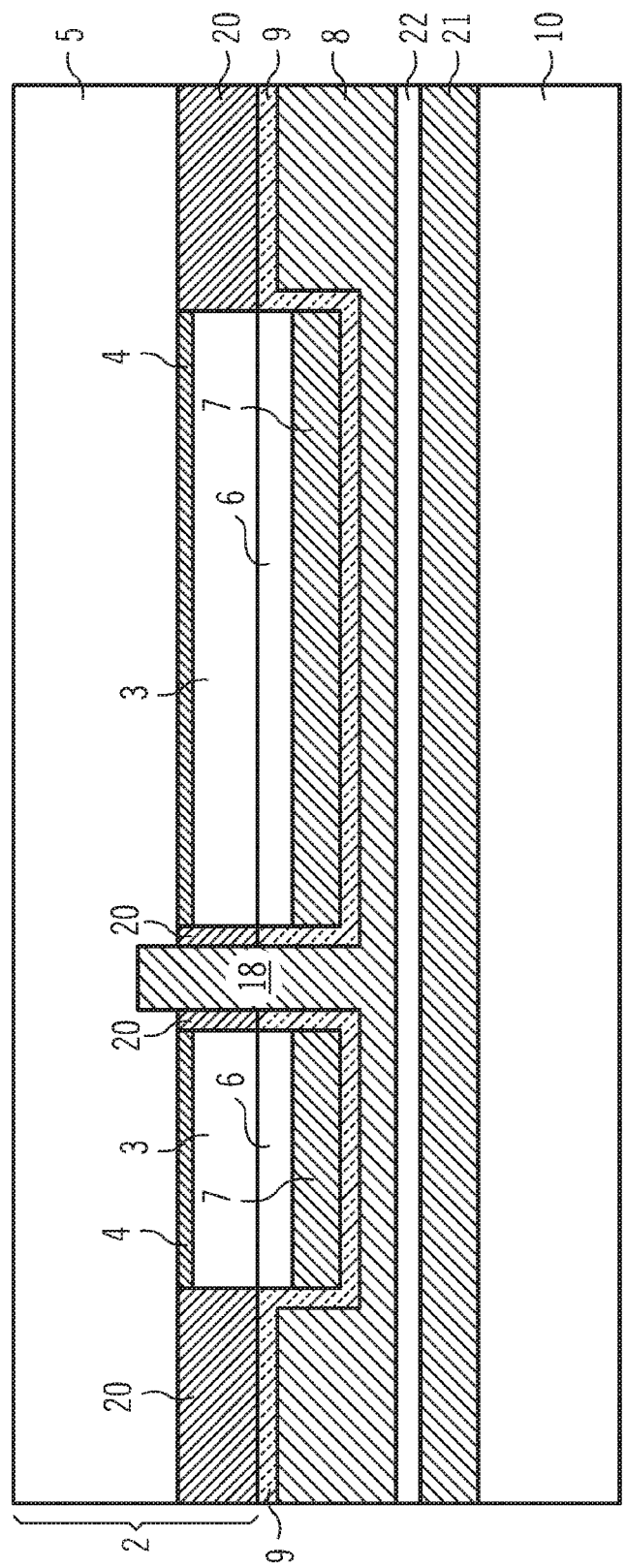

In the intermediate step illustrated in FIG. 2J, the growth substrate 24 has been detached from the semiconductor chip. The semiconductor chip is illustrated in a manner rotated by 180° in comparison with the previous figures, since now the carrier substrate 10 situated opposite the original growth substrate functions as the sole carrier of the semiconductor chip. The growth substrate, in particular a sapphire substrate, can be detached from the semiconductor layer sequence 2 by means of a laser lift-off process, for example.

In the intermediate step illustrated in FIG. 2K, the main surface 12 of the semiconductor layer sequence 2 from which the growth substrate 24 was detached was provided with a coupling-out structure 23, for example by etching using KOH. This is advantageous since the second main surface 12 of the semiconductor layer sequence 2 serves as the radiation coupling-out surface in the finished optoelectronic semiconductor chip.

In the intermediate step illustrated in FIG. 2L, the semiconductor layer sequence 2 was provided with a mesa structure. For this purpose, the semiconductor layer sequence 2 was completely removed in the edge regions of the semiconductor chip in order to produce a semiconductor layer sequence 2 having a desired form and size. The structuring is preferably effected photolithographically, wherein for example, $H_3PO_4$ can be used as etchant and $SiO_2$ can be used as mask. In particular, the semiconductor layer sequence 2 was removed in such a way that a part of the mirror layer 6 and of the electrically insulating layer 9 are exposed alongside the semiconductor layer sequence 2. The semiconductor layer sequence 2 provided with the mesa structure can have oblique side flanks 26. The first electrical contact layer 7 and the second electrical contact layer 8 extend right into regions of the semiconductor chip that are situated laterally alongside the mesa structure.

Figure 2M:
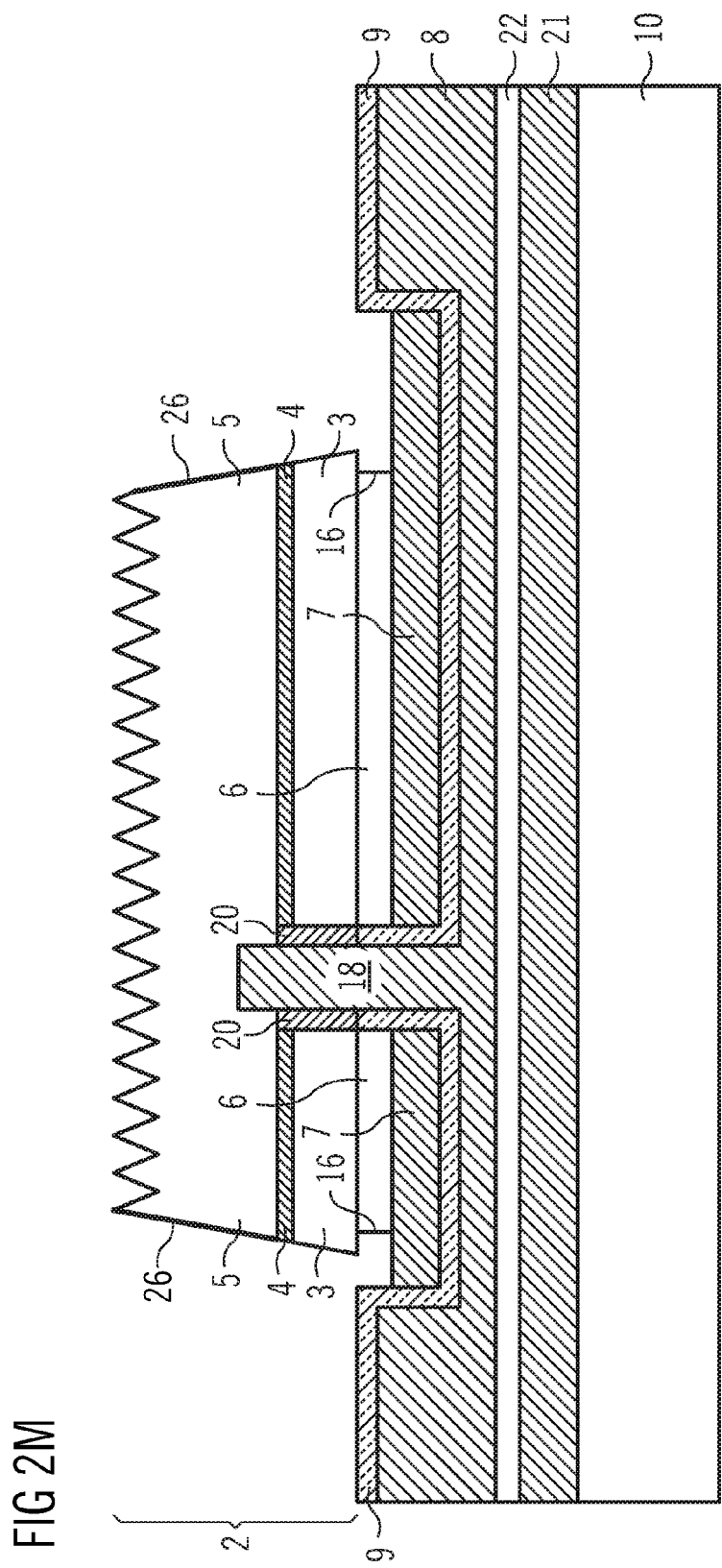
Figure 20:
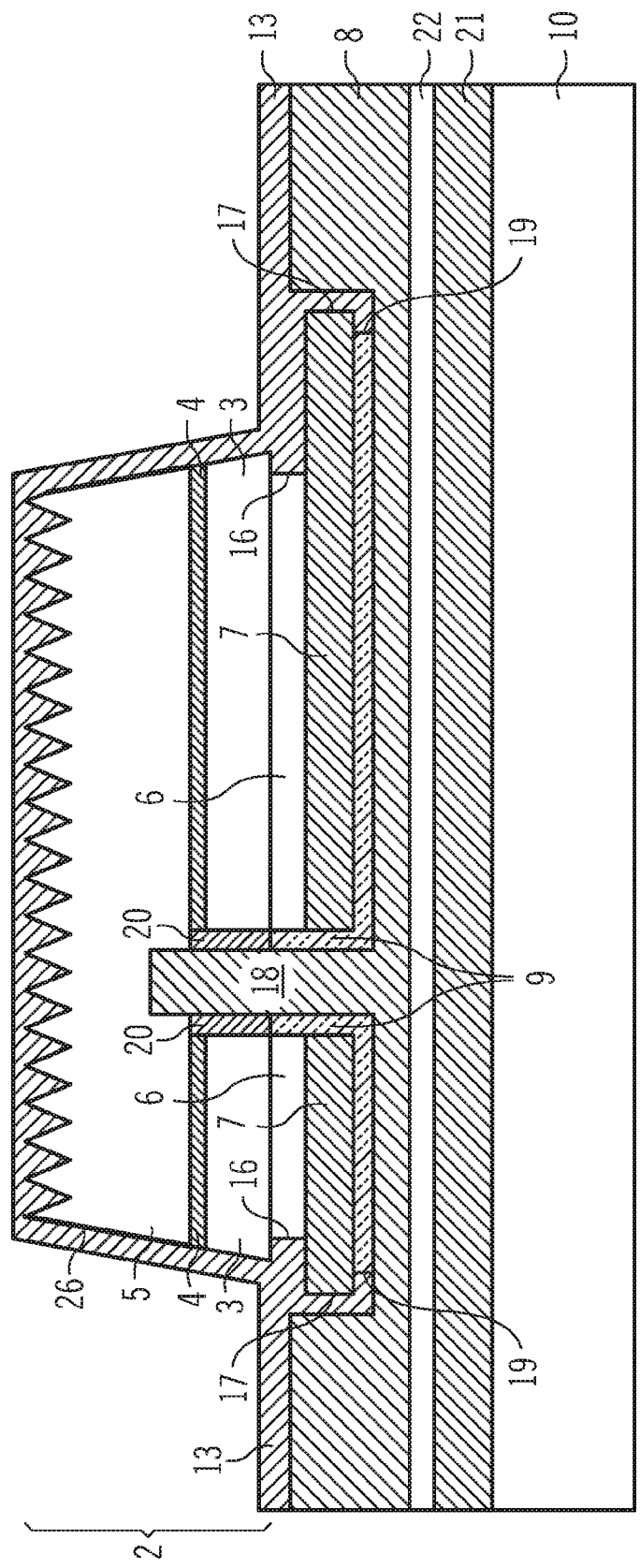

In the method step illustrated in FIG. 2M, a part of the mirror layer 6 was removed using an etchant suitable for selectively etching the mirror layer 6. In this case, the semiconductor layer sequence 2 and the electrically insulating layer 9 function as etching mask. The semiconductor layer sequence is advantageously undercut during the etching process, with the result that an interspace forms between the semiconductor layer sequence 2 and the first electrical contact layer 7. The mirror layer 6 therefore has a smaller lateral extent than the adjoining semiconductor layer sequence 2. In particular, the side flanks 16 of the mirror layer 6 are at a distance from the side flanks 26 of the semiconductor layer sequence 2. The distance is preferably between 0.5 µm and 5 µm.

In the intermediate step illustrated in FIG. 2N, the regions of the electrically insulating layer 9 not covered by the first electrical contact layer 7 were removed. This can be effected, for example, by etching by means of buffered hydrofluoric acid. What is achieved in this way, in particular, is that the electrically insulating layer 9 no longer extends as far as the side surfaces 15 of the semiconductor chip. The side surfaces 17 of the first electrical contact layer 7 that were previously covered by the electrically insulating layer 9 are exposed by the etching process. Furthermore, exposed side surfaces 19 of the electrically insulating layer 9 are produced below the first electrical contact layer 7. In this case, the first electrical contact layer 7 is preferably partly undercut, with the result that the side surfaces 19 of the electrically insulating layer 9 are laterally spaced apart from the side surfaces 17 of the first electrical contact layer 7.

In the intermediate step illustrated in FIG. 2O, an electrically insulating transparent encapsulation layer 13 has been applied to the layer structure produced in this way. The transparent encapsulation layer 13 preferably contains $Al_2O_3$ or $SiO_2$ or consists thereof. The transparent encapsulation layer 13 is preferably produced at least partly by means of atomic layer deposition (ALD). Alternatively, the transparent encapsulation layer 13 can be applied at least partly as spin-on glass. Particularly, pure and impermeable layers can advantageously be deposited with these methods for layer deposition. Furthermore, these methods have the advantage that layer deposition is also possible in comparatively small interspaces. In particular, the transparent encapsulation layer 13 is deposited in such a way that it completely fills the interspaces adjoining the side surfaces 16 of the mirror layer 6 and the side surfaces 19 of the electrically insulating layer 9.

It is possible that firstly a first sublayer of the transparent encapsulation layer 13 is applied by means of atomic layer deposition or as spin-on glass, in order to fill the cavities produced in the layer structure. The first sublayer produced in this way can subsequently be reinforced by a second sublayer, applied by means of CVD, for example. The transparent encapsulation layer 13 advantageously completely covers the semiconductor layer sequence 2, i.e., both the side surfaces 26 and the second main surface 12 serving as the radiation exit surface. It has been found that fine cracks possibly present at the surfaces of the semiconductor layer sequence 2 can be closed by the transparent encapsulation layer 13, thereby reducing the risk of corrosion or ingress of moisture.

In order to complete the optoelectronic semiconductor chip 1 illustrated in FIG. 1, subsequently alongside the semiconductor layer sequence 2 structured as a mesa an opening is produced in the transparent encapsulation layer 13, the first electrical contact layer 7 being exposed in said opening. The opening is produced, for example, by photolithography and reactive ion etching. A connection contact 14 is applied in said opening. The connection contact 14 can contain gold and/or platinum, for example. The connection contact 14 can be, in particular, a bonding pad provided for the connection of a bonding wire. The connection contact 14 is preferably arranged outside the center of the semiconductor chip 1, in particular in the region of a corner of the semiconductor chip 1. A further electrical connection for the semiconductor chip 1 can be provided at the rear side of the preferably electrically conductive carrier substrate 10, in order to electrically connect the second electrical contact layer 8 in this way.

The exemplary embodiment of an optoelectronic semiconductor chip 1 as illustrated in FIG. 1 was produced in this way. The production method is distinguished, in particular, by the fact that only four photolithography steps are necessary, such that the production outlay is comparatively low despite the complex encapsulation of the semiconductor chip.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:
1. An optoelectronic semiconductor chip comprising:
a carrier substrate;
a semiconductor layer sequence having a first semiconductor region of a first conduction type, a second semiconductor region of a second conduction type, and an active zone arranged between the first semiconductor region and the second semiconductor region, wherein the semiconductor layer sequence has a first main surface facing the carrier substrate and an opposite second main surface;

a first electrical contact layer and a second electrical contact layer arranged at least regionally between the carrier substrate and the first main surface of the semiconductor layer sequence, wherein the second electrical contact layer is led through a perforation in the first semiconductor region and the active zone into the second semiconductor region;

an electrically insulating layer electrically insulating the first electrical contact layer and the second electrical contact layer from one another;

a mirror layer arranged between the semiconductor layer sequence and the carrier substrate, wherein the mirror layer comprises silver, aluminum or a silver or aluminum alloy; and a transparent encapsulation layer in direct contact with side surfaces of the semiconductor layer sequence, side surfaces of the mirror layer and side surfaces of the electrically insulating layer that face the side surfaces of the semiconductor chip, wherein the semiconductor layer sequence is completely covered by the transparent encapsulation layer.

2. The optoelectronic semiconductor chip according to claim 1, wherein the transparent encapsulation layer comprises an aluminum oxide or a silicon oxide.

3. The optoelectronic semiconductor chip according to claim 1, wherein the transparent encapsulation layer comprises an ALD layer.

4. The optoelectronic semiconductor chip according to claim 1, wherein the transparent encapsulation layer comprises a spin-on glass.

5. The optoelectronic semiconductor chip according to claim 1, wherein the mirror layer has a smaller lateral extent than the semiconductor layer sequence and wherein partial regions of the transparent encapsulation layer extend below the semiconductor layer sequence.

6. The optoelectronic semiconductor chip according to claim 1, wherein the second main surface is covered by the transparent encapsulation layer.

7. The optoelectronic semiconductor chip according to claim 1, wherein the semiconductor layer sequence has a mesa structure and the first electrical contact layer and second electrical contact layer extend right into regions arranged laterally alongside the mesa structure.

8. The optoelectronic semiconductor chip according to claim 7, wherein the transparent encapsulation layer has an opening alongside the mesa structure in which a connection contact for the first electrical contact layer is arranged.

9. The optoelectronic semiconductor chip according to claim 8, wherein the connection contact is arranged outside a center of the optoelectronic semiconductor chip.

10. The optoelectronic semiconductor chip according to claim 1, wherein the first electrical contact layer comprises gold, titanium, chromium, platinum, titanium nitride, titanium tungsten nitride or nickel.

11. The optoelectronic semiconductor chip according to claim 1, wherein the second electrical contact layer comprises silver, aluminum or a silver or aluminum alloy.

12. The optoelectronic semiconductor chip according to claim 1, wherein the electrically insulating layer comprises a silicon oxide, a silicon nitride, a silicon oxynitride or an aluminum oxide.

13. The optoelectronic semiconductor chip according to claim 1, wherein the electrically insulating layer at no point adjoins a surrounding medium of the optoelectronic semiconductor chip.

14. The optoelectronic semiconductor chip according to claim 1, wherein the side surfaces of the mirror layer are surrounded by the transparent encapsulation layer on all sides.

15. The optoelectronic semiconductor chip according to claim 1, wherein the first electrical contact layer contacts the first semiconductor region and the second electrical contact layer contacts the second semiconductor region.

* * * * *